(12) United States Patent
Jung

(10) Patent No.: US 6,668,352 B1
(45) Date of Patent: Dec. 23, 2003

(54) DISTORTION COMPENSATING DEVICE AND METHOD IN A MULTI-CODE MOBILE COMMUNICATION SYSTEM

(75) Inventor: Gill-Young Jung, Yongin shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/560,733

(22) Filed: Apr. 28, 2000

(30) Foreign Application Priority Data

Apr. 28, 1999 (KR) .......................................... 1999-15222

(51) Int. Cl.⁷ .......................... H03M 13/00; H04L 9/00; H04L 7/00; H04B 17/00
(52) U.S. Cl. ........................ 714/800; 380/46; 375/346; 375/367; 714/746; 714/780
(58) Field of Search ................................ 375/227, 346, 375/367; 714/800, 780, 746, 799, 801, 703; 380/46

(56) References Cited

U.S. PATENT DOCUMENTS

| | | | | |
|---|---|---|---|---|
| 4,685,132 A | * | 8/1987 | Bishop et al. ................. 380/46 |
| 5,461,629 A | * | 10/1995 | Sutterlin et al. ............. 714/746 |
| 5,841,806 A | * | 11/1998 | Gilhousen et al. ........... 375/146 |
| 5,943,361 A | * | 8/1999 | Gilhousen et al. ........... 375/142 |
| 6,094,465 A | * | 7/2000 | Stein et al. ................... 375/346 |
| 6,163,566 A | * | 12/2000 | Shiino ......................... 375/143 |
| 6,175,558 B1 | * | 1/2001 | Miya ........................... 370/335 |
| 6,175,587 B1 | * | 1/2001 | Madhow et al. ............. 375/148 |
| 6,233,271 B1 | * | 5/2001 | Jones et al. .................. 375/142 |
| 6,292,519 B1 | * | 9/2001 | Popovic ....................... 375/346 |
| 6,356,528 B1 | * | 3/2002 | Lundby et al. .............. 370/209 |
| 6,356,601 B1 | * | 3/2002 | Chen et al. .................. 375/340 |

OTHER PUBLICATIONS

Joachim Hagenauer, Forward Error Correcting for CDMA Systems, Aug. 1996, IEEE, pp. 566–569.*
Herbert Taub and Donald L. Schilling, 1986, McGraw–Hill Book Company, 2nd Edition, 532–538.*

* cited by examiner

Primary Examiner—Phung M. Chung
Assistant Examiner—Anthony T. Whittington
(74) Attorney, Agent, or Firm—Dilworth & Barrese, LLP

(57) ABSTRACT

A receiving device in a multi-code mobile communication system is disclosed. In the multi-code mobile communication system, user serial data is broken down into a plurality of parallel data channels and parity data is generated from the user parallel data. The parity data is transmitted on a redundancy channel. In the receiving device, each symbol is decided using multi-codes from a signal received on the data and redundancy channels. An energy calculator in the receiving device calculates the energy of each decided symbol. A parity checker determines whether errors have been generated by checking the parity of symbol data, and a sign inverter inverts the sign of a symbol with the smallest energy as calculated by the energy calculator if it is determined that errors have been generated and thus corrects the errors.

8 Claims, 4 Drawing Sheets

DISTORTION COMPENSATING DEVICE AND METHOD IN A MULTI-CODE MOBILE COMMUNICATION SYSTEM

PRIORITY

This application claims priority to an application entitled "Distortion Compensating Device and Method in a Multi-code Mobile Communication System" filed in the Korean Industrial Property Office on Apr. 28, 1999 and assigned Serial No. 99-15222, the contents of which are hereby incorporated by reference.

BACKGROUND OF THE INVENTION

1. Field of the Invention

The present invention relates generally to a multi-code mobile communication system, and in particular, to a device and method for compensating for signal distortion produced during multi-code transmission in a CDMA (Code Division Multiple Access) mobile communication system.

2. Description of the Related Art

The most challenging issue in the rapidly developing mobile communication industry is efficient use of limited radio frequency bandwidth. High speed transmission using multi-codes is one of the methods of efficiently providing radio multi-media service without increasing bandwidth. Multi-code transmission is the process of converting high rate data to a plurality of parallel low rate data streams, assigning an orthogonal code, and, thus, a code channel, to each parallel code channel which transmits each of the converted parallel low rate data streams, and combining the orthogonally spread code channels for transmission.

FIG. 1 is a block diagram of a typical transmitter in a multi-code using mobile communication system. The transmitter transmits data using four orthogonal codes. A transmitter 10 provides a signal to a specific receiver, or subscriber, and is one of a plurality of transmitters that are identical in structure.

Referring to FIG. 1, the transmitter 10 is comprised of a serial-to-parallel converter (SPC) 101, five multipliers 102 to 105 and 107, an adder 106, and an amplifier 108. The SPC 101 converts input serial user bit stream $b_1(t)$ into four parallel symbol bit streams $b_{11}(t)$ to $b_{14}(t)$. The multiplier 102 orthogonally spreads symbol bit stream $b_{11}(t)$ with orthogonal code $W_{11}(t)$ by multiplication. The multiplier 103 orthogonally spreads symbol bit stream $b_{12}(t)$ with orthogonal code $W_{12}(t)$ by multiplication. The multiplier 104 orthogonally spread symbol bit stream $b_{13}(t)$ with orthogonal code $W_{13}(t)$ by multiplication. The multiplier 105 orthogonally spreads symbol bit stream $b_{14}(t)$ with orthogonal code $W_{14}(t)$ by multiplication. The adder 106 sums the spread symbols bits received from the multipliers 102 to 105 on a bit basis. The multiplier 107 PN-spreads the output of the adder 106 with a first PN code $PN_1(t)$ by multiplication. The amplifier 108 amplifies the PN-spread signal received from the multiplier 107, for transmission.

As described above, the conventional transmitter converts a signal to a specific subscriber into a parallel signal, spreads each parallel signal with a different orthogonal code, sums the spread signals, spreads the sum with a predetermined PN code, and amplifies the PN-spread signal. The spreading of different orthogonal codes is considered multi-code communication.

Signals output from transmitters #1 to #k can be considered summed in the transmission channel as indicated by reference numeral 11. During propagation in the transmission channel, which may be the atmosphere, the signal is combined with AWGN (Additive White Gaussian Noise).

FIG. 2 is a block diagram of a conventional receiver corresponding to the conventional transmitter using multi-codes. While a plurality of receivers #1 to #k are shown, a receiver 20 for a specific subscriber will be described as representative of them all since they are identical in structure.

Referring to FIG. 2, the receiver 20 is comprised of multipliers 201 to 209, accumulators 210 to 213, deciders 214 to 217, and a parallel-to-serial converter (PSC) 218. The multiplier 201 PN-despreads an input signal r(t) with its own PN code $PN_1(t)$ by multiplication. The multipliers 202 to 205 multiply the PN-despread signal by a conjugate signal $\beta_1 e^{j\Phi}$ for channel compensation. The multipliers 206 to 209 orthogonally demodulate the channel-compensated signals received from the multipliers 202 to 205 with corresponding orthogonal codes $W_{11}(t)$ to $W_{14}(t)$ by multiplication. The orthogonal codes are the same as those used in the transmitter 10 of FIG. 1. The accumulators 210 to 213 accumulate the despread signals received from the multipliers 206 to 209 in symbol units. The deciders 214 to 217 decide symbol bits from the outputs of the accumulators 210 to 213 and output the decision results. The PSC 218 converts the symbols received in parallel according to the decision results of the decider 214 to 217 to serial symbol bits and outputs a symbol bit sequence $b_1(t)$. The PSC 218 is the counterpart of the SPC 101 of FIG. 1.

The receiver 20 PN-despreads an input signal, separates the PN-despread signal. into as many signals as the number of the multi-codes used, in the above example, four signals, multiplies each of the signals with an orthogonal code for orthogonal demodulation, accumulates the orthogonally demodulated signals in symbol units, and then decides symbol bits. Then, the decided signals are converted to a serial signal, which are the symbol bits obtained in the receiver 20.

A signal spread by multi-codes passes through a transmitter amplifier with an increased peak-to-average power ratio, relative to a signal spread by a single code. In general, the high power amplifier (HPA) used as the transmitter amplifier in a multi-code system shows a non-linear characteristic. Therefore, the nature of the HPA causes signal distortion when its saturation point is set too high. That's why the saturation point of the transmitter amplifier is decreased to reduce signal distortion in a transmitter. However, a decrease in the saturation point leads to a corresponding decrease of amplification efficiency. In view of the importance of power consumption to the performance of a mobile station, the above transmitter amplifier is not suitable for a mobile station since it increases power consumption.

Accordingly, there is a need for a receiver that compensates for the signal distortion generated when a signal passes through a transmitter amplifier with a high saturation point in order to prevent deterioration of BER (Bit Error Rate) performance. The high probability of errors in the distorted signal during propagation in the atmosphere reinforces the need for an error compensating device in the receiver.

SUMMARY OF THE INVENTION

It is therefore, an object of the present invention to provide a device and method for effectively compensating for the distortion of an input signal caused by an HPA in a multi-code mobile communication system.

It is another object of the present invention to provide a device and method for correcting errors of a parallel code channel by checking the parity of the code channel with parity data received on a redundancy channel.

Briefly, these and other objects are achieved by providing a receiving device in a multi-code mobile transmission system. In the novel multi-code mobile communication system, user data is transmitted on a plurality of parallel data channels and parity data generated from the user data is transmitted on a redundancy channel. An energy calculator of the receiving device calculates the energy of each symbol output by deciders and indicates the symbol with the smallest energy. A parity checker determines whether errors have been generated by checking the parity of symbol data, and a sign inverter inverts the sign of the symbol with the smallest energy (as indicated by the energy calculator), if it is determined that errors have been generated. Thus, errors are corrected.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

As noted from the description regarding the conventional technology, the multi-code transmission scheme transmits a plurality of low rate code channel signals through a transmitter amplifier, causing an increased peak-to-average power ratio, as compared to the single-code transmission. The non-linear characteristic of the transmitter amplifier distorts the combined single signal. The decrease of the saturation point of the transmitter amplifier is not an effective solution to the distortion since it decreases the amplification efficiency of the amplifier. Therefore, methods using a redundancy code channel have been explored to reduce the distortion of a non-linear power amplifier. In these methods, when high rate data is converted to low rate data for transmission, parity check data is generated from the code channels and transmitted on a redundancy code channel. Despite the advantage of a decreased peak-to-average power ratio and the resulting increase of amplification efficiency (since a signal has a constant envelope before the transmitter amplifier), these methods cannot remove the distortion entirely.

The present invention provides a method of compensating for performance deterioration resulting from signal distortion by utilizing a redundancy code in the receiver, which has been used to reduce the peak-to-average power ratio in the transmitter. That is, the receiver uses a redundancy code channel signal, which was generated by an odd parity check in the transmitter, for error correction of the code channels. If an error is found, the sign of the symbol with the smallest energy is inverted for error correction, thereby compensating for signal distortion produced by the transmitter amplifier. Furthermore, interference signals can be removed more accurately by subtracting distortion-compensated signals of other users from the entire input signal.

Figure 1:
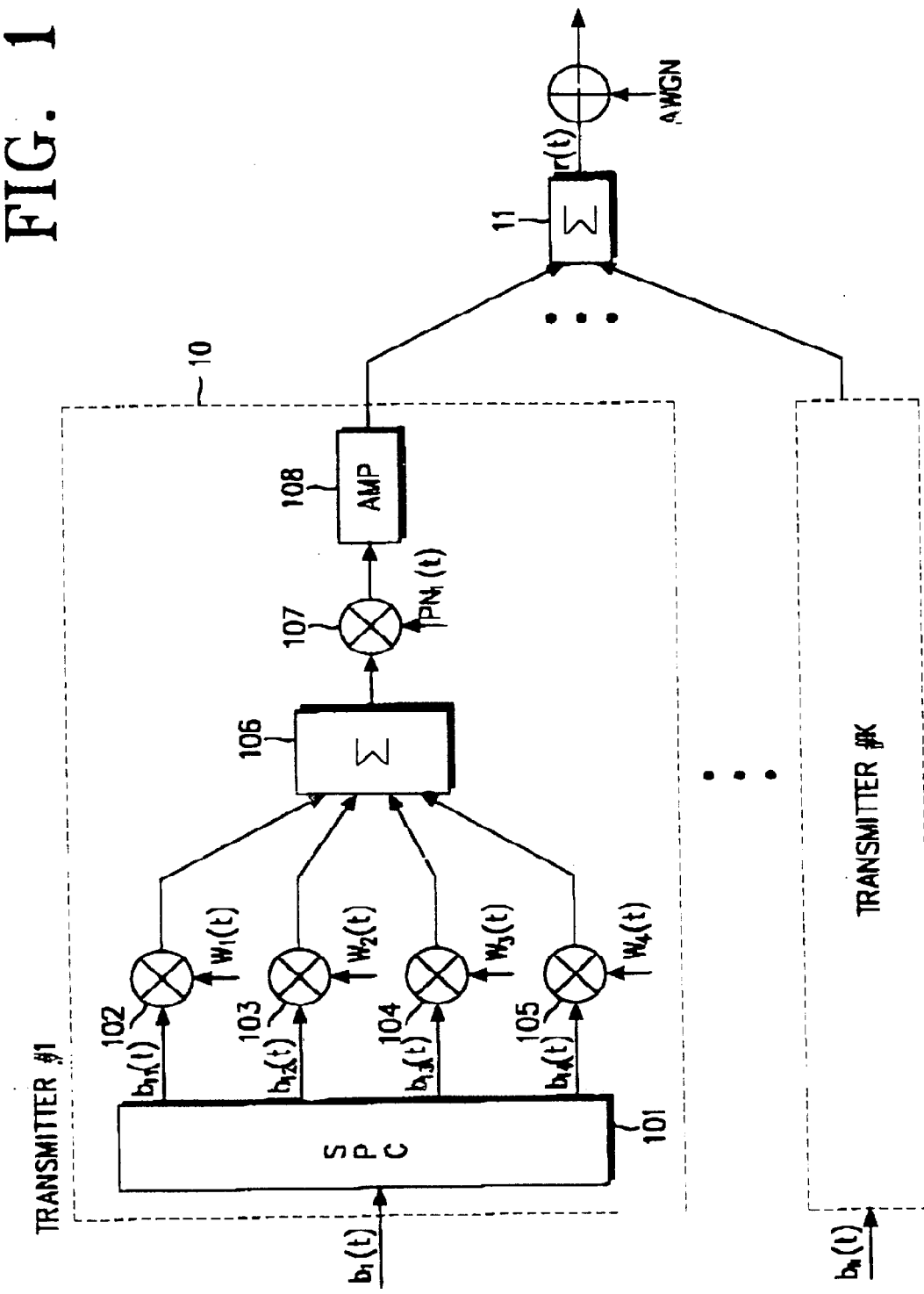
FIG. 1 is a block diagram of a conventional transmitter in a multi-code mobile communication system.
Figure 2:
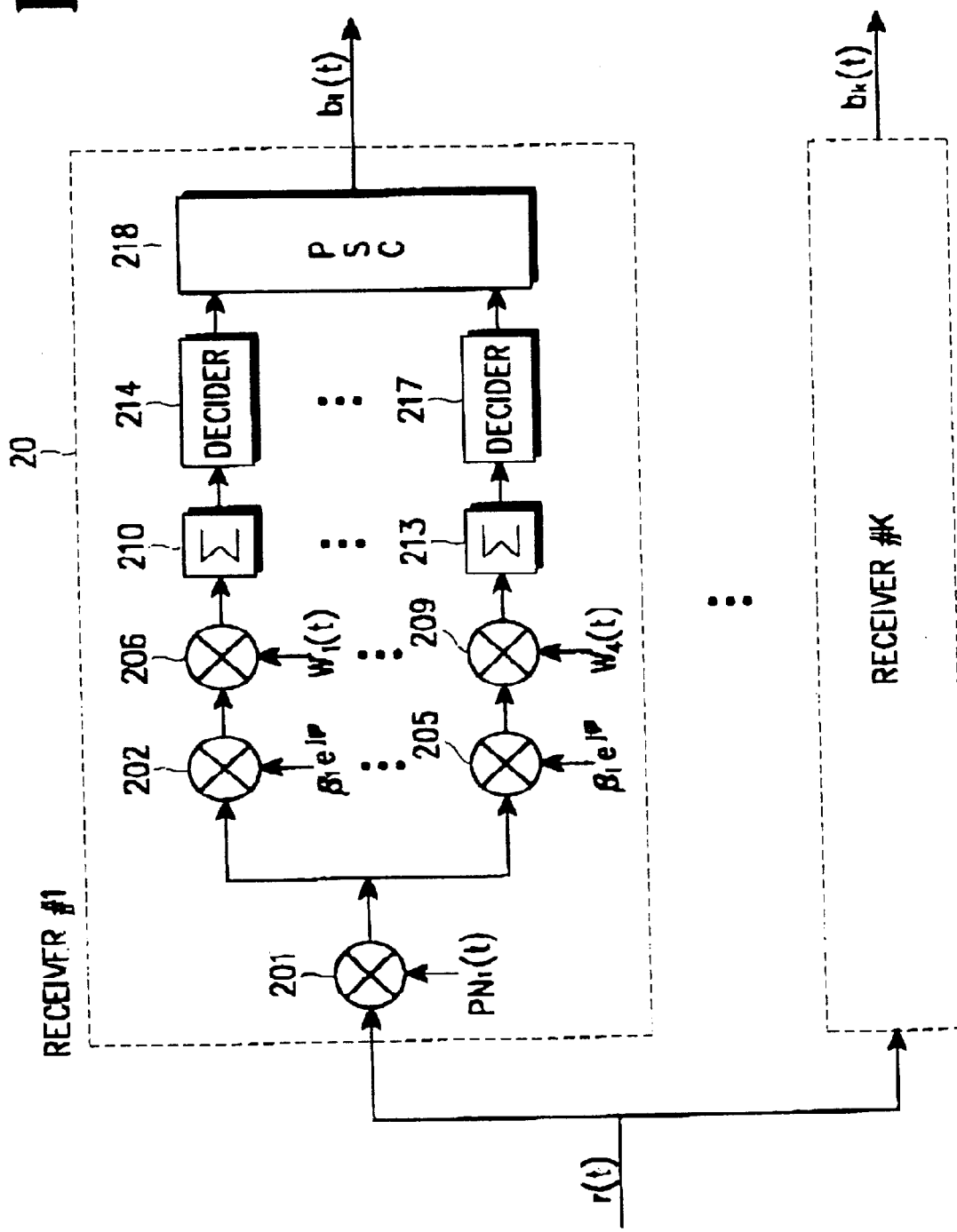
FIG. 2 is a block diagram of a conventional receiver in the multi-code mobile communication system.
Figure 3:
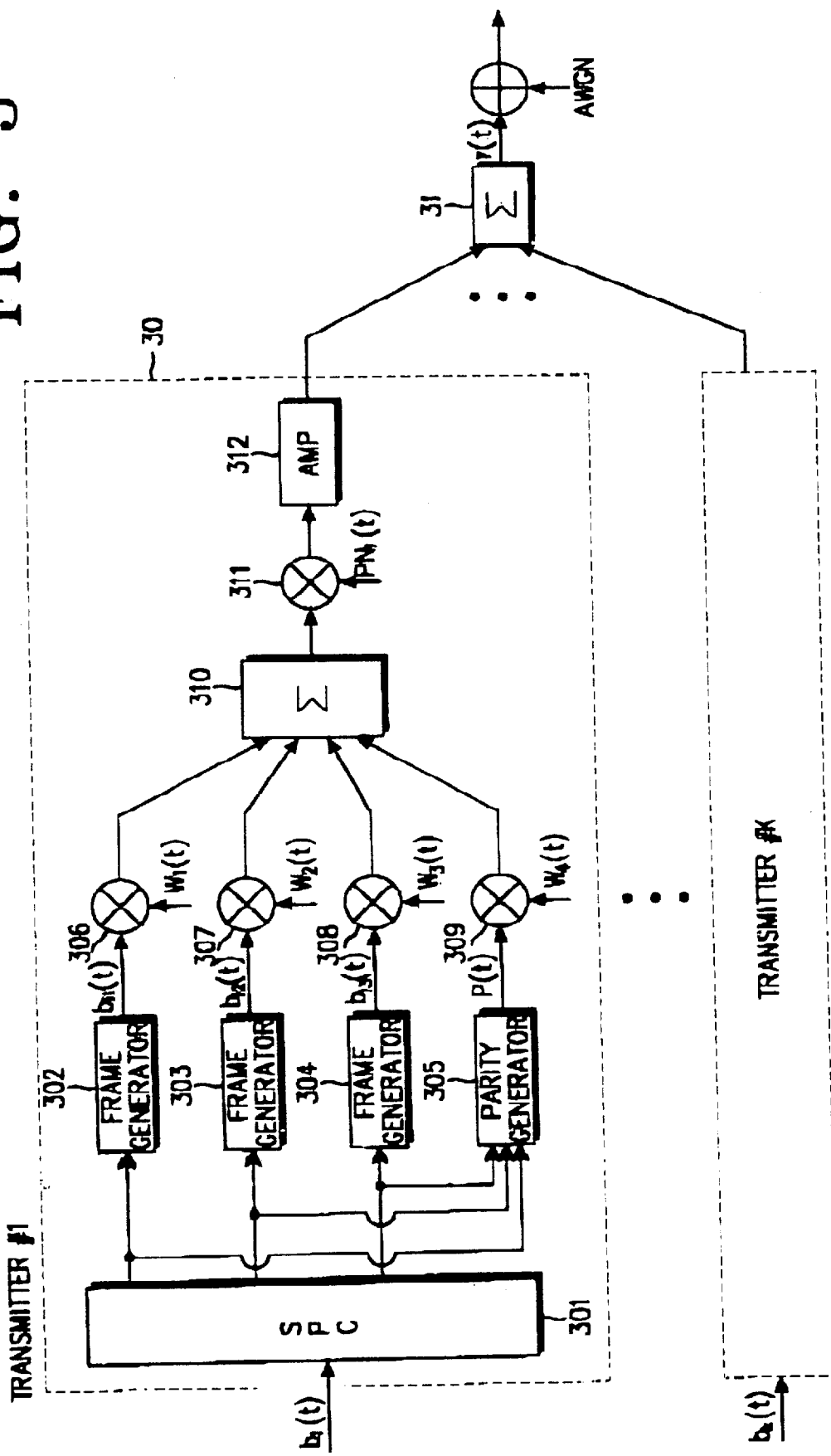
FIG. 3 is a block diagram of a transmitter in a multi-code mobile communication system according to the preferred embodiment of the present invention.

FIG. 3 is a block diagram of a transmitter in a multi-code mobile communication system according to an embodiment of the present invention. Here, the transmitter uses four different orthogonal codes for data transmission. Three of the four code channels transmit user data while the last code channel transmits parity check data obtained by parity-checking the symbol data of the three code channels. Since all transmitters for all mobile stations are identical in structure, a transmitter 30 of a specific mobile structure will be described as representative of them all.

Referring to FIG. 3, the transmitter 30 is comprised of an SPC 301, frame generators 302 and 303, a parity generator 305, multipliers 306 to 309 and 311, an adder 310, and an amplifier 312. The SPC 301 converts a serial input user symbol bit stream $b_1(t)$ into three parallel symbol bit streams. The frame generators 302, 303, and 304 store symbol bits received from the SPC 301 in frame units and output the stored symbol bits a predetermined time later. The parity generator 305 monitors the three parallel symbol bits received from the SPC 301, generates a parity bit for the three symbol bits, and stores the parity bit. Upon completion of generating parity data for one frame, the generated parity data is output in a frame unit. The multiplier 306 orthogonally spreads a symbol in bit stream $b_{11}(t)$ received from the frame generator 302 with a first orthogonal code $W_1(t)$ by multiplication. The multiplier 307 orthogonally spreads a symbol in bit stream $b_{12}(t)$ received from the frame generator 303 with a second orthogonal code $W_2(t)$ by multiplication. The multiplier 308 orthogonally spreads a symbol in bit stream $b_{13}(t)$ received from the frame generator 304 with a third orthogonal code $W_3(t)$ by multiplication. The multiplier 309 orthogonally spreads a parity bit p(t) received from the parity generator 305 with a fourth orthogonal code $W_4(t)$ by multiplication. The adder 310 adds the outputs of the multipliers 306 to 309 in chip units. The multiplier 311 PN-spreads the output of the adder 310 with a first PN code $PN_1(t)$ by multiplication. The amplifier 312 amplifies the spread signal received from the multiplier 311.

The above transmitter converts a signal from a specific subscriber to as many parallel signals as code channels to be transmitted and spreads each parallel signal with a different orthogonal code. Meanwhile, the transmitter generates a parity signal for the parallel signals and spreads the parity signal with an orthogonal code different from the orthogonal codes used on the parallel data streams. As is known in the art, if the parallel signals are {1 1 1} and odd parity is used, the parity signal is {0}. The spread signals, including both the parallel signals and the parity signal, are added, PN-spread with a predetermined PN code, and amplified. Here, a channel which transmits a parallel user data signal is called a data code channel, and a channel which transmits the parity signal is called a redundancy code channel. The signals of transmitters #1 to #k can be considered added, as indicated by reference numeral 31, as well as combined with AWGN during propagation in the atmosphere.

Figure 4:
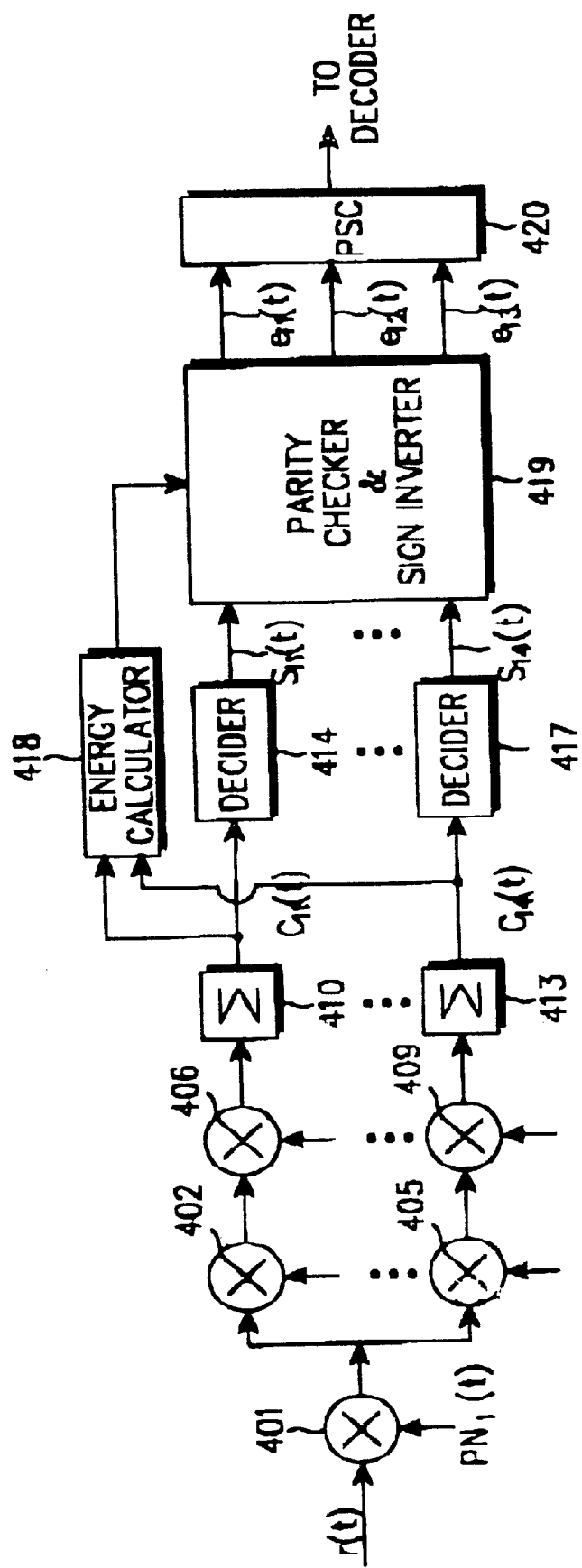
FIG. 4 is a block diagram of a receiver in the multi-code mobile communication system according to the preferred embodiment of the present invention.

FIG. 4 is a block diagram of a receiver corresponding to the transmitter of FIG. 3 in a multi-code mobile communication system according to the preferred embodiment of the present invention. While a plurality of receivers are shown in the drawing, the following description is made in regards to receiver 40 since all the receivers are the same in structure.

Referring to FIG. 4, a multiplier 401 despreads an input signal r(t) with the corresponding PN code $PN_1(t)$ by multiplication. The input signal r(t) is a combination of signals transmitted from transmitters and the PN code $PN_1(t)$ is the same as that used in the transmitter of FIG. 3. Multipliers 402 to 405 multiply the PN-despread signal by the conjugate signal $\beta_1 e^{j\phi}$ obtained from channel estimation, for channel compensation. Multipliers 406 to 409 multiply the channel-compensated signals received from the multipliers 402 to 405 by the different orthogonal codes $W_1(t)$ to $W_4(t)$, for channel demodulation. The orthogonal codes $W_1(t)$ to $W_4(t)$ are the same as those used in the transmitter of FIG. 3. The use of multi-codes is equivalent to use of different channelization codes (i.e., orthogonal codes or Walsh codes). Accumulators 410 to 413 accumulate the outputs of the multipliers 406 to 409 in symbol units. Accumulated signals $c_{11}(t)$ to $c_{14}(t)$ are applied to the input of deciders 414 to 417 and to the input of energy calculator 418, as well. The reason for feeding the signals $c_{11}(t)$ to $c_{14}(t)$ to energy calculator 418 is to detect errors by calculating symbol energy. The deciders 414 to 417 decide symbol data (symbol bits $s_{11}(t)$ to $s_{14}(t)$) by subjecting the outputs of the accumulators 410 to 413 to hard decision. The parity checker & sign inverter 419 detects symbol bits with errors from signals $s_{11}(t)$ to $s_{14}(t)$, which are output from deciders 414 to 417, and the output signals of the energy calculator 418, and then inverts the signs of the symbol bits with errors, thereby correcting the errors. A parallel to serial converter (PSC) 420 converts three parallel inputs $e_{11}(t)$ to $e_{13}(t)$ into a serial symbol bit stream.

The energy calculator 418 calculates symbol energy for each of the signals $c_{11}(t)$ to $c_{14}(t)$ received from the accumulators 410 to 413 and outputs an indicator indicating which symbol has the smallest energy. The parity checker & sign inverter 419 performs a parity check on the symbol data $s_{11}(t)$ to $s_{14}(t)$. Here, the symbol data $s_{11}(t)$, $s_{12}(t)$, and $s_{13}(t)$ is actual user data and $s_{14}(t)$ is parity data added after parity check. When the parity checker & sign inverter 419 determines that an error has been generated through the parity check, it inverts the sign of the symbol with the smallest energy (as indicated by the energy calculator 418), thereby correcting the error. The error-corrected symbols output from parity checker and sign inverter 419 are represented by $e_{11}(t)$, $e_{12}(t)$, and $e_{13}(t)$ in FIG. 4.

Now, the operation of the preferred embodiment of the present invention will be described in detail.

As described above, upon receipt of r(t), each receiver despreads r(t) with a corresponding PN code $PN_1(t)$ and multiples the PN-despread signal with a conjugate signal $\beta_1 e^{j\phi}$, for channel compensation. Then, the receiver obtains symbol data by demodulating each channel-compensated channel signals with its corresponding orthogonal code. The symbol data is inaccurate data since it includes the interference components of the other user signals. Therefore, the receiver checks the parity of the demodulated symbol data to determine whether errors exist in the parity checker & sign inverter according to the preferred embodiment of the present invention. If an error is found by the parity check, the sign of a symbol with the smallest energy is inverted, thereby correcting the error.

As an example, let the demodulated parallel symbol data at the receiver be {1, 1, 1, 1}. However, the last bit, the parity bit, should be {0} if the first three user data bits are {1, 1, 1}. In the parity check of the error corrector 418, the demodulated data of the redundancy channel, i.e., the parity bit, is {1}. In this case, it is determined that an error has been generated. Then, the sign of a channel (or a symbol) with the smallest energy is inverted for distortion compensation because, when a transmission signal including code channels combined passes through an HPA and a multi-path fading environment, the code channel signal which loses the most signal components has the smallest energy at a receiver. For example, if a third data code channel has the smallest symbol energy, it is determined that the error has been generated in that code channel and the sign of the symbol is inverted to compensate for distortion. On the other hand, if the symbol data of the redundancy code channel has the smallest energy, it is determined that the redundancy code channel has the error, and thus the symbol data of the data code channels are fed to the PSC 420 without sign inversion. The symbol data is applied to a decoder which recovers the original user data.

In accordance with the present invention as described above, the intended user signals are distortion-compensated using parity data received on redundancy channels.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A receiving device in a multi-code mobile communication system where user data is transmitted on a plurality of parallel data channels and parity data generated from the user data is transmitted on a redundancy channel, comprising:

an energy calculator for calculating an energy of each accumulated signal;

a parity checker for determining whether errors have been generated by checking a parity of symbol data; and a sign inverter for inverting a sign of a symbol with a smallest energy, said inversion being performed if it is determined that errors have been generated.

2. The receiving device of claim 1, further comprising:

a multiplier for PN-despreading a signal received on the data channels and the redundancy channel with a PN code;

first multipliers for multiplying the PN-despread signal with corresponding conjugate signals, to perform channel compensation;

second multipliers for multiplying the channel-compensated signals with corresponding orthogonal codes, to perform channel demodulation;

accumulators for accumulating the despread signals; and deciders for deciding each symbol.

3. A receiving device in a multi-code mobile communication system where user data is transmitted on a plurality of parallel data channels and parity data generated from the user data is transmitted on a redundancy channel, comprising:

an energy calculator for calculating a symbol energy for each signal received from an accumulator; and a parity checker & sign inverter for determining whether errors have been generated by checking a parity of symbol data and inverting a sign of a symbol with a smallest energy as calculated by the energy calculator, if it is determined that errors have been generated.

4. A device for compensating for distortion of an input signal in a multi-code mobile communication system, comprising:
- a plurality of data channel transmitters for converting user serial data to parallel data streams, for spreading each parallel data stream with a different spreading code, and for transmitting each spread data stream on a parallel data channel;
- a redundancy channel transmitter for generating parity data from the parallel data streams, for spreading the parity data with a spreading code different from the spreading codes used for the user parallel data streams, and for transmitting the spread parity data on a redundancy channel; and a receiving device comprising:
  - an energy calculator for calculating the energy of each symbol, said each symbol being decided using multi-codes from the signal received on the data channels and the redundancy channel, and
  - a parity checker and sign inverter for determining whether errors have been generated by checking a parity of received symbol data and inverting a sign of a symbol with a smallest energy, as indicated by the energy calculator, if it is determined that errors have been generated.

5. A receiving method in a multi-code mobile communication system where user data is transmitted on a plurality of parallel data channels and parity data generated from the user data is transmitted on a redundancy channel, comprising the steps of:
- deciding each symbol using multi-codes from a signal received on the data and redundancy channels;
- calculating an energy of each accumulated signal;
- determining whether errors have been generated by checking a parity of symbol data; and
- inverting a sign of a symbol with a smallest energy if it is determined that errors have been generated.

6. The receiving method of claim 5, further comprising the steps of:
- PN-despreading the signal received on the data channels and the redundancy channel with a PN code;
- multiplying the PN-despread signal with corresponding conjugate signals, for channel compensation;
- multiplying the channel-compensated signals with corresponding orthogonal codes, for channel demodulation; and
- accumulating the channel-demodulated signals in symbol units as symbol data.

7. A receiving method for a receiving device in a multi-code mobile communication system where user data is transmitted on a plurality of parallel data channels, parity data generated from the user data is transmitted on a redundancy channel, and at least two mobile stations, comprising the steps of:
- deciding each symbol using multi-codes from a signal received on the data and redundancy channels; and
- correcting errors by calculating an energy of each accumulated signal, determining whether errors have been generated by checking a parity of decided symbols, and inverting a sign of a symbol with a smallest energy if it is determined that errors have been generated.

8. A method for compensating for distortion of an input signal in a multi-code mobile communication system, comprising the steps of:
- converting a user serial data stream to parallel data streams;
- spreading each parallel data stream with a different spreading code;
- transmitting the spread parallel data streams on a plurality of parallel data channels;
- generating parity data from the parallel data streams;
- spreading the parity data with a spreading code different from the spreading codes used for the parallel user data streams;
- transmitting the spread parity data on a redundancy channel;
- deciding symbols using multi-codes from a signal received on the data and redundancy channels;
- calculating the energy of each decided symbol;
- determining whether errors have been generated by checking the parity of symbol data; and
- inverting the sign of a symbol with the smallest energy if it is determined that errors have been generated.

* * * * *